US006346744B1

(12) United States Patent
Geller

(10) Patent No.: US 6,346,744 B1
(45) Date of Patent: Feb. 12, 2002

(54) INTEGRATED RF M×N SWITCH MATRIX

(75) Inventor: Bernard Dov Geller, Princeton, NJ (US)

(73) Assignee: Sarnoff Corporation, Princeton, NJ (US)

(*) Notice: Subject to any disclaimer, the term of this patent is extended or adjusted under 35 U.S.C. 154(b) by 0 days.

(21) Appl. No.: 09/643,462

(22) Filed: Aug. 22, 2000

Related U.S. Application Data

(60) Provisional application No. 60/153,782, filed on Sep. 14, 1999.

(51) Int. Cl.[7] ............................................. H01L 23/34
(52) U.S. Cl. ........................ 257/724; 257/723; 257/728
(58) Field of Search ................................ 257/723, 724, 257/728; 333/101, 103

(56) References Cited

U.S. PATENT DOCUMENTS

| | | | |
|---|---|---|---|
| 4,364,044 A | 12/1982 | Kusano | 340/825.85 |
| 4,605,928 A | 8/1986 | Georgiou | 340/825.94 |
| 5,150,083 A | * 9/1992 | Chen et al. | |
| 5,159,700 A | * 10/1992 | Reid et al. | |
| 5,227,781 A | 7/1993 | Ninnis | 340/825.91 |
| 5,469,001 A | 11/1995 | Vaillant | 307/113 |
| 5,473,293 A | * 12/1995 | Chigodo et al. | |
| 5,481,073 A | * 1/1996 | Singer et al. | |
| 5,491,482 A | * 2/1996 | Dingwell et al. | |
| 5,502,445 A | * 3/1996 | Dingwell et al. | |
| 5,550,342 A | * 8/1996 | Danek et al. | |
| 5,796,377 A | 8/1998 | Gonzalez et al. | 345/84 |
| 5,867,060 A | * 2/1999 | Burkett et al. | |
| 5,932,936 A | 8/1999 | Potthast et al. | 307/113 |
| 6,064,127 A | 5/2000 | Vaillant | 307/113 |

FOREIGN PATENT DOCUMENTS

EP    0 240 805    10/1987    ............ H04Q/3/52

* cited by examiner

Primary Examiner—Sheila V. Clark
(74) Attorney, Agent, or Firm—William J. Burke

(57) ABSTRACT

A switch matrix comprising a mulitlayer ceramic circuit board having a M×N array of N×N switch modules. Specifically, the ceramic circuit board has a M×N array of mounting sites for accepting individual N×N switch modules. The ceramic circuit board contains all the necessary interconnects to form a M×N RF switch matrix.

10 Claims, 2 Drawing Sheets

US 6,346,744 B1

INTEGRATED RF M×N SWITCH MATRIX

This application claims the benefit of United States Provisional Application No. 60/153,782, filed Sep. 14, 1999, and is hereby incorporated herein by reference.

The invention relates to a RF switch matrix and, more particularly, the invention relates to an integrated RF M×N switch matrix using N×N switch modules.

BACKGROUND OF THE DISCLOSURE

Switch matrices are critical components in virtually all modern communications systems, especially satellite systems. Such matrices are used principally to route up-link channels to a specific down-link channel. In some instances, switch matrices may have a "broadcast mode" in that an individual incoming signal is simultaneously routed to a number of outgoing channels for transmission.

RF switches come in a variety of configurations, the most basic being a single pole, single throw having a single RF input and a single RF output. Typically the RF signal is switched electronically with RF switching diodes or field effect transistors. Such RF switches are combined to form M×N switch matrices and are typically constructed using Monolithic Microwave Integrated Circuitry (MMIC) techniques wherein nonintersecting transmission lines, interconnections, and switch elements are integrated on a multilevel substrate using thin film processing techniques. The MMIC technique is impractical in most instances where there are numerous inputs and outputs to be switched because chip size becomes very large due to circuit complexity.

Thus, there exists a need in the art for automated production of efficient, reliable switch matrices that are able to operate in the RF frequency range.

SUMMARY OF THE INVENTION

The disadvantages associated with the prior art are overcome by forming an M×N RF switch matrix using a multilayer ceramic circuit board that accommodates M×N switch modules, each switch module being an N×N switch matrix. The ceramic structure exhibits low RF loss and the metal base functions both as a heatsink and as a RF ground. The circuit board has an M×N array of mounting sites for accepting the switch modules and contains all the necessary RF routing, bias, and control lines to interconnect the switch modules to from the M×N switch matrix.

In one embodiment of the invention, the circuit board is a multilayer ceramic structure on a metal base that is fired using a Low Temperature Ceramic Circuit on Metal (LTCC-M) process. An LTCC-M process provides for zero-shrinkage in the plane of the circuit board allowing for the fabrication of large-area boards with tight tolerances over the entire area of the board. The switch modules can be MMIC devices or can also be fabricated using an LTCC-M process. The switch modules attach to the ceramic circuit board at the mounting sites via wire-bonds or flip-chip bonds. The mounting sites are punch cavities whereby the metal base of each switch module is coupled to the metal base of the motherboard. The switch modules are interconnected by the circuit board to from an M×N switch matrix. In an alternative embodiment of the invention, the switch modules are surface mounted to the circuit board at the mounting sites.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
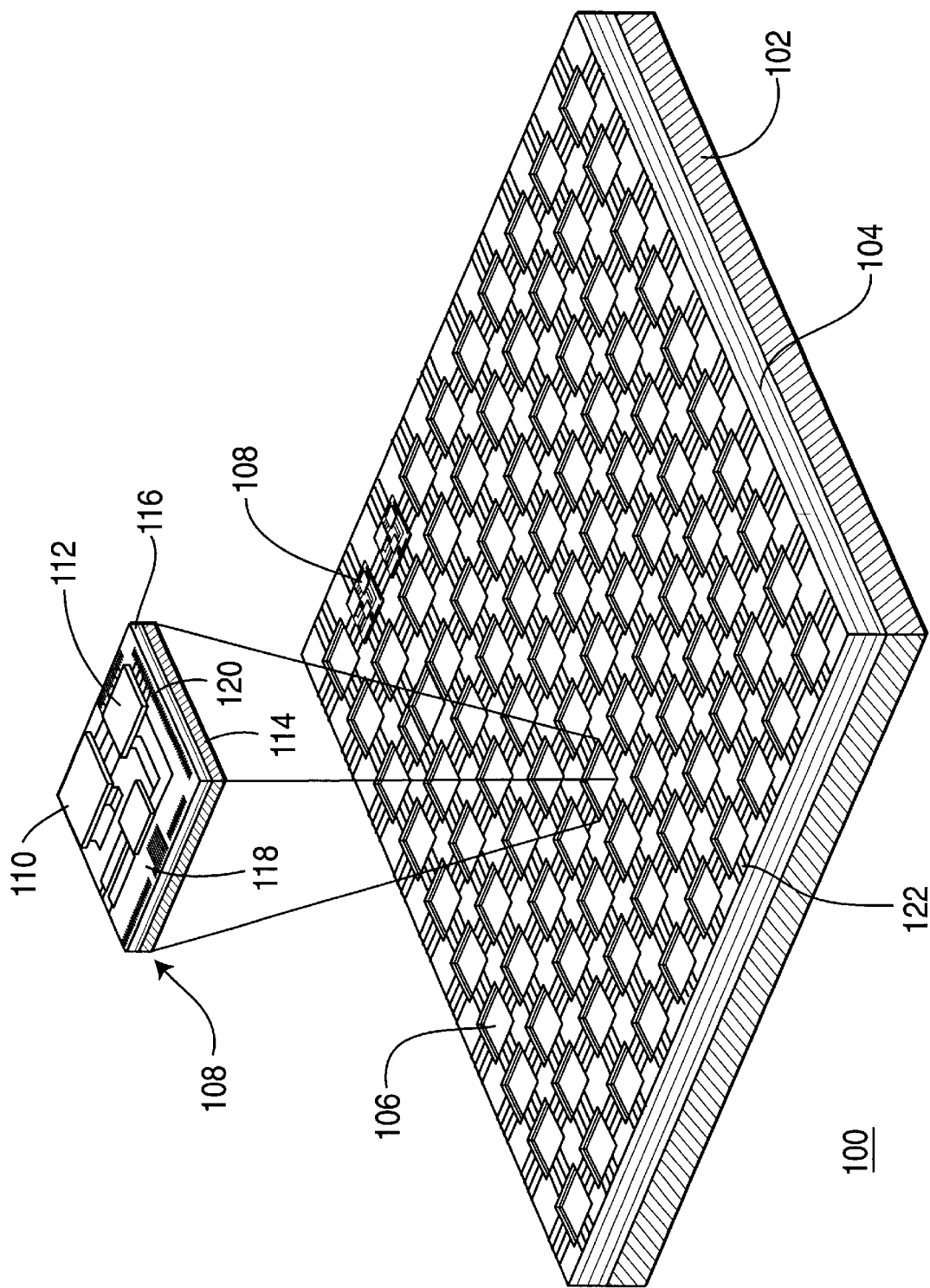
FIG. 1 depicts a M×N RF switch matrix.

FIG. 1 depicts one embodiment of an M×N RF switch matrix 100 in accordance with the present invention. The switch matrix 100 comprises a multilayer ceramic circuit board 104 that is adhered to a metal base 102 and a plurality of switch modules 108. The ceramic circuit board 104 has an M×N array of mounting sites 106 (e.g., 10×10 are shown) for attaching the switch modules 108 to the ceramic circuit board 104. In the preferred embodiment of the invention, the ceramic circuit board 104 and the metal base 102 are of the type commonly used in an LTCC-M firing process.

Multilayer ceramic circuit boards have been in use for several decades and are advantageously used to from integrated RF circuits. The electric properties of ceramics and metals used in an LTCC-M process are suitable for both low and high frequency operation. An LTCC-M manufacturing process is geared to low cost, highly automated production and is well suited to integrated RF sub-system applications. The multi-layer capability of LTCC-M technology allows for the design of compact structures, with short lengths between components, resulting in lower losses and better overall performance.

Dimensions of a typical switch matrix are on the order of tens of wavelengths and require tight tolerances in integrated circuit production. LTCC-M exhibits zero shrinkage in the x and y dimensions of the board, allowing for the fabrication of large-area circuit boards and the definition of conductor patterns with tight tolerances over the entire large area of the board. For a detailed description of LTCC-M technology, the reader should refer to commonly assigned U.S. Pat. No. 5,725,808, issued Mar. 10, 1998, and commonly assigned U.S. Pat. No. 5,958,807, issued Sep. 28, 1999.

In this illustrative embodiment of the invention, each of the plurality of switch modules 108 comprises a multilayer ceramic circuit board 116 adhered to a metal base 114, an integrated N×N switch matrix 112, electronic control circuitry 110, N input transmission line segments 118, and N output transmission line segments 120. As with the main circuit board 104, the module circuit board 116 is of the type commonly used in an LTCC-M fabrication process. The integrated switch matrix 112 has N inputs and N outputs and is capable of switching any of the N inputs to any of the N outputs. The integrated switch matrix 112 is coupled to the input transmission line segments 118 and the output transmission line segments 120 so as to allow the switch module 108 to function as a N×N switch matrix. In an alternative embodiment of the invention, the switch modules 108 are MMIC devices.

Each one of the plurality of switch modules 108 is attached to one of the M×N array of mounting sites 106 via wire-bonds or flip-chip bonds. The mounting sites 106 are punch cavities and the metal base 114 of the module 108 is coupled to the metal base 102 of the main circuit board 104. The input transmission line segments 118 and the output transmission line segments 120 are coupled to respective transmission segments 122 of the main circuit board 104 by wire-bonds so as to form a M×N switch matrix. In an alternative embodiment of the invention, the modules are surface mounted to the main circuit board 102 at the mounting sites 106.

Figure 2:
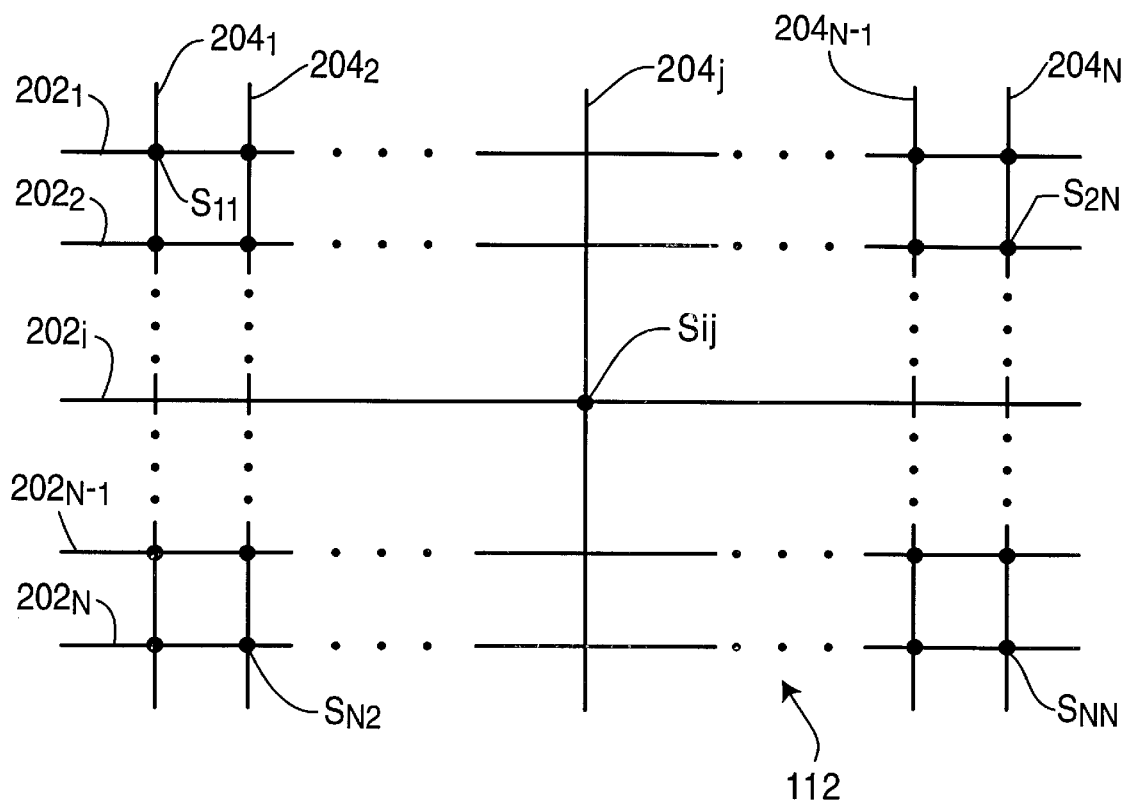
FIG. 2 shows an example of a N×N switch matrix.

FIG. 2 shows an example of a N×N switch matrix 112. The switch matrix 112 comprises N input transmission lines 202, N output transmission lines 204, and a plurality of RF switches $S_{ij}$. The input transmission lines 202 and the output transmission lines 204 are microwave striplines. Each one of the plurality of RF switches $S_{ij}$ is a PIN diode or similar semiconductor switching element. An $i^{th}$ one of the input transmission lines $202_i$ is coupled to a respective one of the switch cells, $S_{ij}$. A $j^{th}$ one of the output transmission lines $204_j$ is coupled to a respective one of the switch cells, $S_{ij}$. In this manner, each one of the input transmission lines 202 is connected to each one of the output transmission lines 204. Alternative methods of constructing an N×N switch matrix are known to those skilled in the art.

Figure 3:
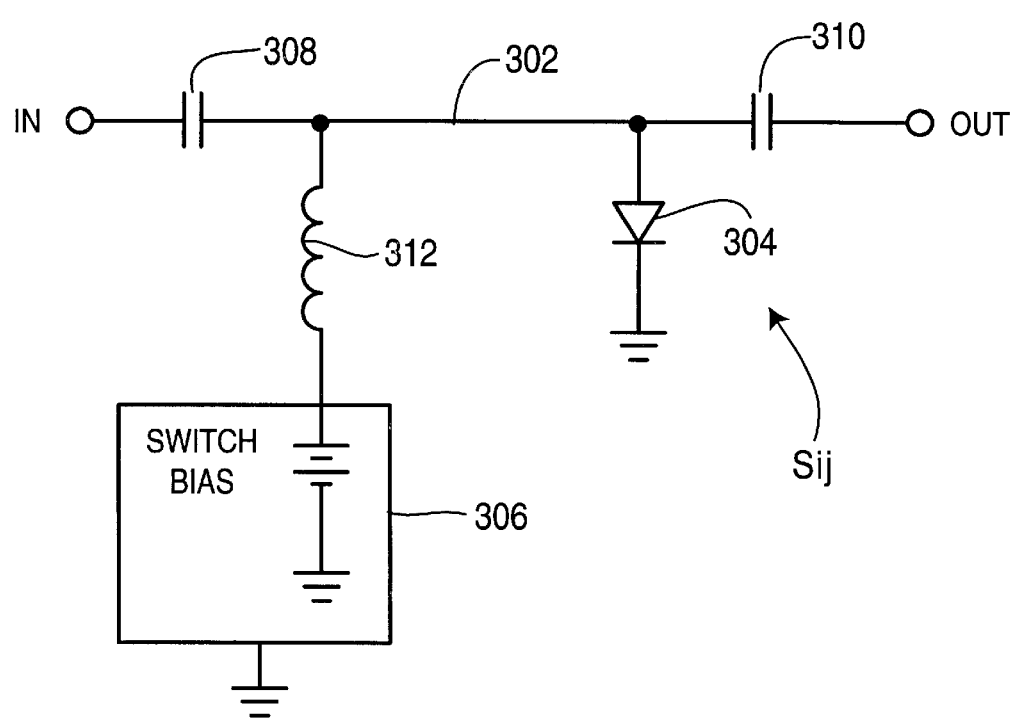
FIG. 3 depicts a schematic of an illustrative RF switch for use in a N×N switch matrix.

FIG. 3 depicts a schematic of an illustrative single pole, single throw RF switch $S_{ij}$. The switch $S_{ij}$ comprises a transmission line segment 302 spanning from switch $S_{ij}$ input to switch $S_{ij}$ output, a PIN diode 304 having an anode and a cathode, an input coupling capacitor 308, an output coupling capacitor 310, and a DC bias source 316 with an inductor 312 (RF choke). The anode of the PIN diode 304 is coupled to the transmission line segment 302 and the cathode of the PIN diode 304 is coupled to ground. he switch $S_{ij}$ is closed when the diode 304 is reverse biased or unbiased, causing the diode 304 to act as an infinite resistance to RF signals thereby allowing the input signal to pass through the transmission line segment 302 from switch input to switch output. The switch $S_{ij}$ is open when the transmission line segment 302 is biased at a positive DC voltage sufficient to forward bias the diode 304, causing the diode 304 to act as a shunt to ground. The input coupling capacitor 308 and the output coupling capacitor 310 block the DC bias voltage from entering the coupled circuitry (not shown). The inductor 312 blocks the RF signal from entering the DC bias 316 circuitry. Alternative switch configurations, for example, MOSFET or other semiconductor type switches, are known to those skilled in the art.

Although various embodiments which incorporate the teachings of the present invention have been shown and described in detail herein, those skilled in the art can readily devise many other varied embodiments that still incorporate these teachings.

What is claimed is:

1. A switch matrix for switching RF signals, said switch matrix comprising:

a ceramic circuit board having M radio frequency (RF) inputs, N RF outputs, a plurality of mounting sites disposed thereon, and a metal base;

a plurality of switch modules having N input segments, N output segments, and a plurality of RF switches, wherein each of said N input segments is coupled to each of said N output segments by a respective one of said plurality of RF switches, each of said plurality of switch modules being attached to said ceramic circuit board at each of said plurality of mounting sites.

2. The switch matrix of claim 1 wherein said mounting sites are cavities.

3. The switch matrix of claim 1 wherein each of said plurality of switch modules is wire-bonded to said ceramic circuit board at each of said plurality of mounting sites.

4. The switch matrix of claim 1 wherein each of said plurality of switch modules is flip-chip bonded to said ceramic circuit board at each of said plurality of mounting sites.

5. The switch matrix of claim 1 wherein said ceramic circuit board is fabricated using an LTCC-M process.

6. The switch matrix of claim 1 wherein each of said plurality of switch modules is fabricated using an LTCC-M process.

7. The switch matrix of claim 1 wherein each of said plurality of switch modules is fabricated using an MMIC process.

8. The switch matrix of claim 1 wherein each of said plurality of RF switches is a semiconductor device.

9. The switch matrix of claim 8 wherein each of said semiconductor devices is a PIN diode.

10. The switch matrix of claim 8 wherein each of said semiconductor devices is a transistor.

* * * * *